United States Patent
Niemelä

(10) Patent No.: US 6,347,222 B1
(45) Date of Patent: Feb. 12, 2002

(54) TUNING METHOD AND TRANSCEIVER UNIT

(75) Inventor: Kari Niemelä, Oulu (FI)

(73) Assignee: Nokia Networks Oy, Espoo (FI)

( * ) Notice: Subject to any disclaimer, the term of this patent is extended or adjusted under 35 U.S.C. 154(b) by 0 days.

(21) Appl. No.: 09/397,412

(22) Filed: Sep. 16, 1999

Related U.S. Application Data

(63) Continuation-in-part of application No. PCT/FI99/00048, filed on Jan. 25, 1999.

(30) Foreign Application Priority Data

Jan. 28, 1998 (FI) .................................................. 980188

(51) Int. Cl.$^7$ ............................................... H03H 7/46
(52) U.S. Cl. ....................... 455/339; 455/340; 455/125; 455/67.1
(58) Field of Search ............................. 455/67.1–67.4, 455/78, 115, 120, 121, 193.1, 125, 226.1, 339, 340; 333/17.1, 104, 132

(56) References Cited

U.S. PATENT DOCUMENTS

| | | | |
|---|---|---|---|
| 4,726,071 A | | 2/1988 | Jachowski ................... 455/125 |
| 5,420,552 A | * | 5/1995 | Sakka ........................ 333/17.1 |
| 5,448,769 A | * | 9/1995 | Jantti ......................... 455/115 |
| 5,473,292 A | * | 12/1995 | Victorin ..................... 333/17.1 |
| 5,525,940 A | * | 6/1996 | Heikkila ..................... 333/17.1 |
| 5,757,247 A | * | 5/1998 | Koukkari et al. ........... 333/17.1 |
| 6,081,700 A | * | 6/2000 | Salvi ......................... 455/193.3 |

FOREIGN PATENT DOCUMENTS

| | | |
|---|---|---|
| EP | 494 058 | 7/1992 |
| WO | WO 93/20616 | 10/1993 |
| WO | WO 94/16496 | 7/1994 |
| WO | WO 97/02616 | 1/1997 |

* cited by examiner

*Primary Examiner*—Vivian Chang
*Assistant Examiner*—Duc Nguyen
(74) *Attorney, Agent, or Firm*—Altera Law Group, LLC

(57) ABSTRACT

The invention relates to a tuning method used in a base station which comprises, in addition to at least one transceiver unit generating signals, a filtering means which is separate from the transceiver unit and filters signals which are generated on the transmitting end of the transceiver unit, of which signals part advances to the filtering means and part is reflected back, and which filtering means is tuned to operate in a predetermined frequency band. The transceiver unit comprises a test signal generating means which generates a control signal and a test signal that is located in a predetermined frequency band, which test signal is transmitted further to the filtering means, a means which generates signals of the same magnitude as the signal which advances to the filtering means and is reflected from the filtering means, which signals are connected from the transmitting end to the receiving end of the transceiver. The transceiver unit further comprises a measuring instrument which measures the power of the signals which are connected to the receiving end and estimates the return loss of the filtering means on the basis of the powers measured, an adjustment means which receives the control signal from the generating means. The adjustment means tunes the filtering means on the basis of the control signal it has received if a return loss value obtained as an estimation result is greater than the predetermined limit value of the return loss.

17 Claims, 2 Drawing Sheets

TUNING METHOD AND TRANSCEIVER UNIT

RELATED APPLICATIONS

This is a continuation-in-part (CIP) of International PCT Application PCT/FI99/00048, filed on Jan. 25, 1999.

FIELD OF THE INVENTION

The invention relates to a tuning method used in a base station which is composed of at least one transceiver unit and a filtering means which is separate from the transceiver unit and filters signals which are generated on the transmitting end of the transceiver unit, of which signals part advances to the filtering means and part is reflected back from the filtering means, and in which method the filtering means is tuned to operate in a predetermined frequency band.

BACKGROUND OF THE INVENTION

Base stations of radio systems often use filters implemented by cavity resonators, for example. The cavity resonators are placed in a separate resonator unit or a resonator case, for example. The purpose of the resonator case is to prevent the interfering signals from causing interference in signals to be filtered. The cavity resonators are tuned to the desired frequency upon commissioning of the radio system. The cavity resonators are tuned manually, for example. In tuning, an adjustment element located in the cavity resonator is adjusted with a suitable manual tool, for example.

Although the resonators are tuned to filter signals of a given frequency, they do not always stay in a predetermined frequency band, for which reason a desired filtering result is not obtained. The centre frequency of the resonators may change because of a change of temperature, for instance, and, consequently, the working range of the resonator changes.

Since manual tuning is time-consuming, a motor is commonly used for tuning the cavity resonators. The motor, such as a stepping motor, is connected to an adjustment element located in the cavity resonator to be tuned. The motor moves the adjustment element, whereby the filtering frequency of the resonator changes. Furthermore, the resonator unit may comprise measuring instruments which measure the cavity resonator before it is tuned. On the basis of the measurement data, a control signal is generated in the base station, and the control signal is used for controlling the motor to move the adjustment element of the cavity resonator.

The base station typically comprises several transceiver units, and each transceiver unit communicates with a specific cavity resonator unit. Each cavity resonator receives a signal from the transceiver unit and filters the signal it has received. The resonator unit comprises a measuring instrument which is located in the resonator unit or in the resonator case. The measuring instrument measures a signal which is reflected from the cavity resonator, and a control signal of the adjustment element of the cavity resonator is generated on the basis thereof. However, the prior art solution increases the size of the resonator unit, since implementing the solution requires a relatively large number of components. The number of components increases particularly when the measuring instruments are placed in the resonator unit. In addition, the practical implementation of the prior art tuning method is relatively complicated because of inefficient utilization of solutions that already exist in the base station.

BRIEF DESCRIPTION OF THE INVENTION

It is therefore an object of the invention to provide a tuning method and a transceiver unit so as to solve the above problems. This is achieved by a tuning method of the type presented in the introduction, which is characterized by generating a test signal which is located in a predetermined frequency band and transmitted to the filtering means, generating signals of the same magnitude as the signal which advances to the filtering means and is reflected from the filtering means, and which signals are connected from the transmitting end to the receiving end of the transceiver unit, measuring the power of the signals that are connected to the receiving end, estimating the return loss of the filtering means on the basis of the power values measured, and when the return loss is greater than a limit value predetermined for it, the filtering means is tuned to carry out a more efficient filtering of the predetermined frequency band.

The invention also relates to a transceiver unit used in a base station which comprises, in addition to at least one signal-generating transceiver unit, a filter means which is separate from the transceiver unit and filters signals which are generated at the transmitting end of the transceiver, and of which signals part advances to the filtering means and part is reflected back, and which filter means is tuned to operate in a predetermined frequency band.

The transceiver unit is characterized in that the transceiver unit comprises a test signal generating means which generates a control signal and a test signal that is located in a predetermined frequency band, which test signal is transmitted further to the filtering means, a means which generates signals of the same magnitude as the signal which advances to the filtering means and is reflected from the filtering means, which signals are connected from the transmitting end to the receiving end of the transceiver, a measuring instrument which measures the power of the signals which are connected to the receiving end and estimates the return loss of the filtering means on the basis of the powers measured, an adjustment means which receives the control signal from the generating means and tunes the filtering means on the basis of the control signal it has received if a return loss value obtained as an estimation result is greater than the predetermined limit value of the return loss.

The preferred embodiments of the invention are disclosed in the attached dependent claims.

The invention is based on the idea that a signal which is reflected from a filtering means and advances to the filtering means is connected to the receiving end by means of a TRX loop used in a transceiver unit, whereupon it is possible to tune the filtering means by using the components which are located at the receiving end.

The tuning method and transceiver unit of the invention provide many advantages. The tuning method enables the use of base station components already implemented, whereupon the filtering means, such as a cavity resonator, can be tuned with fewer components. The structure of the base station can be simplified by using the existing components. The structure of the resonator unit, in particular, becomes more simple, because it is possible to remove some of the existing components therefrom. The implementation of a more simple structure is cost-effective as compared with the solution implemented by the prior art. Furthermore, because of fewer components required, the solution of the invention also reduces the probability of a failure in the base station. The method also enables the tuning of the filtering means during the operation of the base station.

BRIEF DESCRIPTION OF THE DRAWINGS

In the following, the invention will be described by means of preferred embodiments with reference to the accompanying drawings, in which.

DETAILED DESCRIPTION OF THE INVENTION

Figure 1:
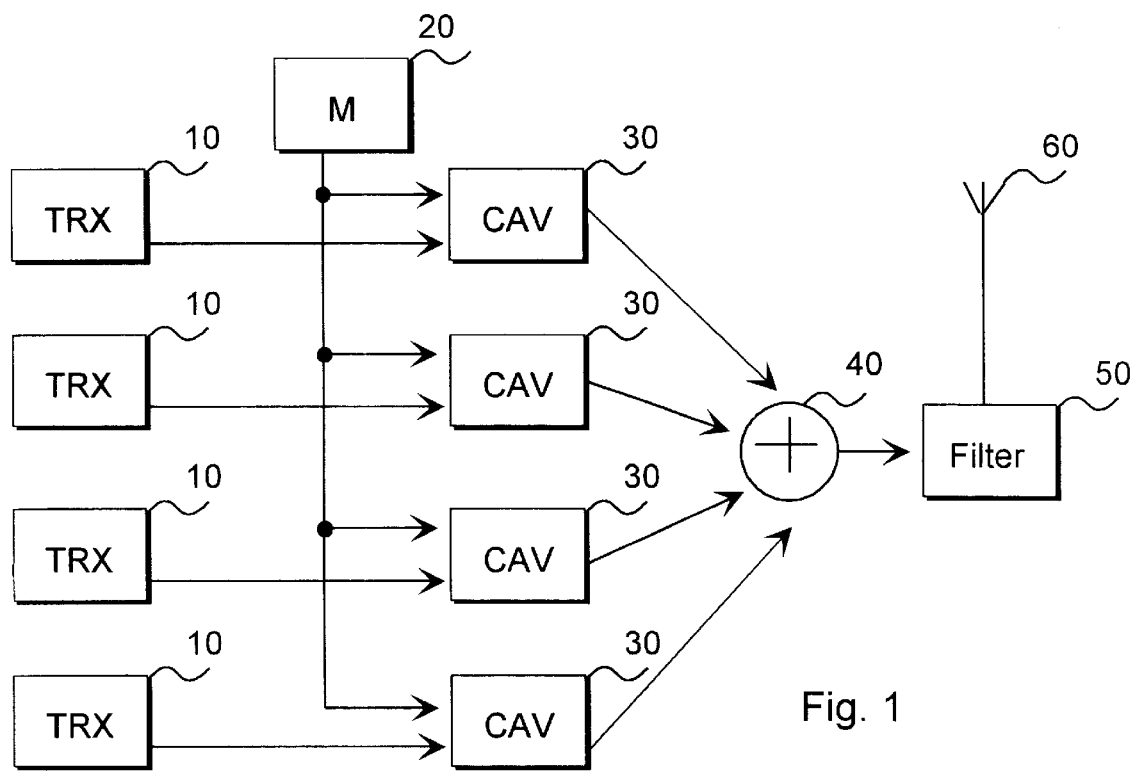
FIG. 1 shows the structure of a transmitter end of a base station.

FIG. 1 shows the structure of a transmitter end of a base station. The base station comprises a set of transceiver units 10, a set of filtering means 30, at least one adjustment means 20, a summing element 40, a filtering element 50 and an antenna 60. The output of each transceiver unit is connected to a specific filtering means 30 which filters signals generated by the transceiver unit. The filtering means 30 are placed in filtering units which are separate from the transceiver unit 10. Each filtering unit is connected to a specific transceiver unit 10 via a cable, for instance. In practice, all filtering means 30 are enclosed inside the same casing structure.

The adjustment means 20 is connected to each filtering means 30. Each filtering means 30 may also have a specific adjustment means. The output of each filtering means 30 is connected to the input of the summing element 40. The output of the summing element 40 is connected via the filtering element 50 to the antenna 60 which, in practice, operates as a transceiver antenna. The main function of the summing element 40 is to combine the output signals of the base station transceiver unit to the antenna 60 via the same antenna cable.

Figure 2:
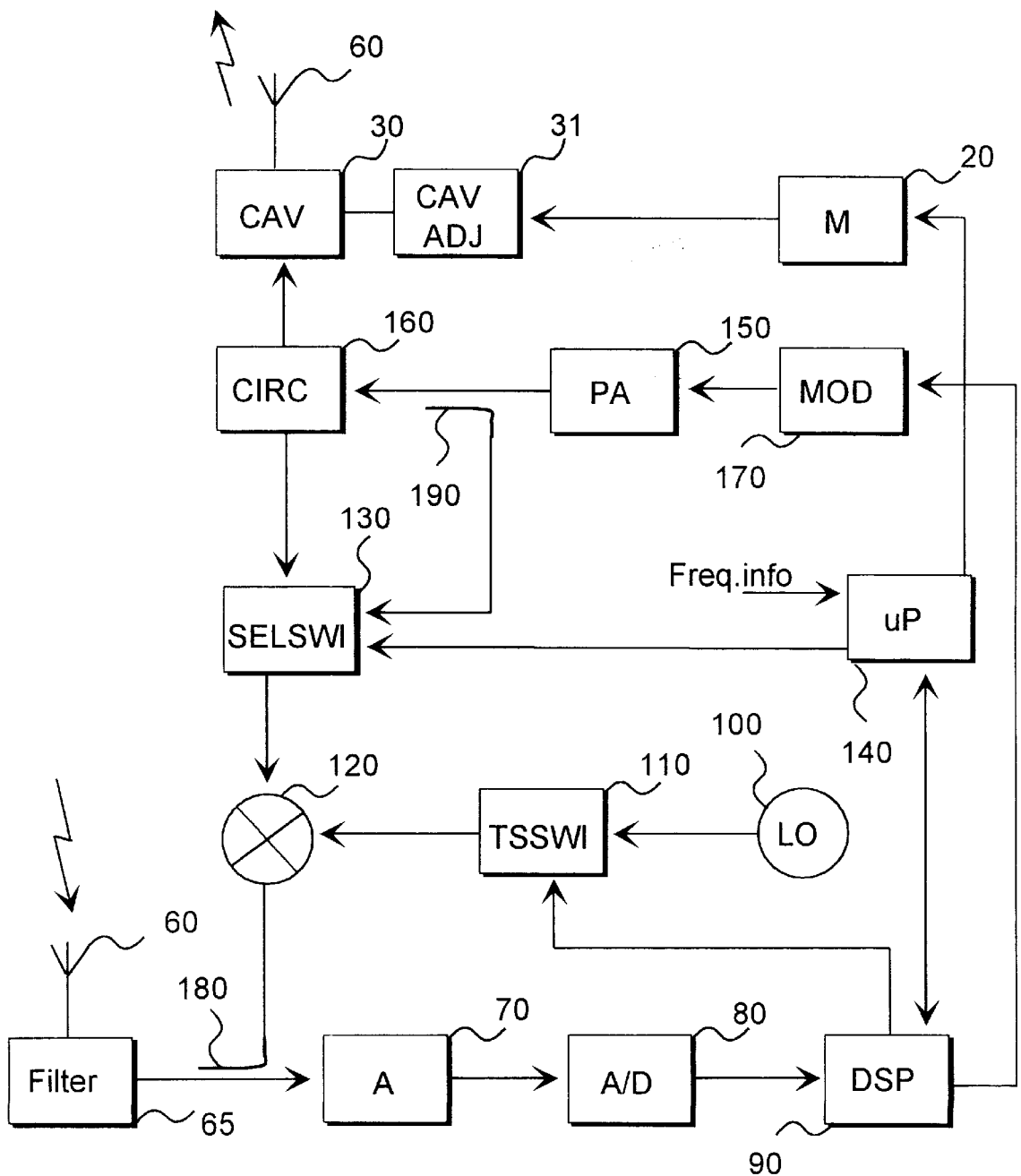
FIG. 2 shows the structure of a transceiver unit of a base station.

FIG. 2 shows the structure of a transceiver unit in more detail. The transceiver unit comprises a filtering element 65, an amplifier means 70 and converter means 80. In addition thereto, the transceiver unit comprises a measuring means 90, an oscillator 100, a switching means 110, a multiplication means 120, a switching means 130, a generating means 140, an amplifier means 150, a means 160, a modulation means 170, a connecting means 180 and a connecting means 190.

In practice, the connecting means 180 and 190 are directional couplers which enable samples to be taken from a signal. The directional couplers also enable the powers of the signals to be combined to one port. The connecting means 180 is connected between the filtering element 65 and the amplifier means 70. The connecting means 190 is connected between the amplifier means 150 and the means 160. The filtering means 30 is connected via a cable, for instance, to the means 160 located in the transceiver.

The filtering means 30 filter signals generated by the transceiver. More precisely, the filtering means 30 filter signals generated by the transmitter unit. In practice, the filtering means 30 are implemented by a cavity resonator or a corresponding signal filtering means, for instance. Upon commissioning of the base station, the filtering means 30 are usually set to filter pre-desired frequencies. In practice, however, the filtering means 30 are not ideal components, for the operation of the filtering means may be affected by temperature, for instance, in which case the filtering means may also filter frequencies other than predetermined frequencies. For this reason, the filtering means 30 have to be re-tuned from time to time so as to ensure that the filtering means 30 function in a desired manner even in a changed operation environment. FIG. 2 shows that the transceiver comprises an adjustment element 31 connected to the filtering means 30, and the filtering means 30 can be tuned by adjusting the adjustment element.

When the transceiver receives a signal which arrives from a radio path to the antenna 60, the signal received is applied to the filtering element 65, which lets only the desired signals of the received signal pass to the amplifier means 70. The transceiver typically measures the intensity and power of the signal it has received from the radio path. On the basis of the measurement, the transceiver can, for example, set an amplification factor used in the amplification means 70. Let us assume that the transceiver uses the measuring means 90 for measuring the signal it has received.

The filtering means 30 are tuned as follows. First, a transmission management computer, for instance, gives a tuning initiation command. In the solution of FIG. 2, the command is applied to the generating means 140 which is, in practice, a microprocessor, for instance. The command received by the generating means may include information on frequencies used in the tuning, for instance. Next, the generating means 140 commands the measuring means to generate a test signal which is forwarded to the modulation means 170. The measuring means 90 can be implemented by a DSP processor, for example. The modulation means 170 modulates the test signal and places the modulated signal into a time slot. Next, the modulated signal is applied to the amplifier means 150 to be amplified. The amplifier means 150 is typically a power amplifier.

The amplified signal is applied to the filtering means 30 via the means 160. Part of the test signal is reflected back to the means 160 from the filtering means 30, and the other part of the test signal advances to the filtering means 30. The means 160 generates signals of the same magnitude as the signal which advances to the filtering means 30 and is reflected from the filtering means 30. The means 160 can be easily implemented by a circulator, for instance. In other words, the means 160 doubles the signal which advances to the filtering means 30 and is reflected from the filtering means 30. The switching means 130 selects either the signal being reflected or the advancing signal and forwards the selected signal to the measuring means 90. The switching means 110 enables the signal to be connected to the receiver end time slot-specifically.

The doubled signals are applied from the transmitting end to the receiving end of the transceiver and the measuring means 90 at the receiving end measures the power of the doubled signals. In addition, the measuring means 90 estimates the return loss of the filtering means 30 on the basis of the powers it has measured. The estimation can be carried out by means of the power difference of the signal that has advanced to the filtering means 30 and is reflected therefrom. The measuring means 90 measures the power of the signals that are connected to the receiving end by first indicating the signal measured in narrow band.

When the return loss value obtained as an estimation result is greater than the predetermined limit value of the return loss, the filtering means 30 is tuned to carry out a more efficient filtering of the desired frequency band. If the estimation gives a return loss value greater than the limit value of the return loss, then the generating means 140 generates a control signal which is applied to the adjustment means 20. In practice, the adjustment means 20 is implemented by a stepping motor, for instance. The adjustment means 20 is operationally connected to the adjustment element 31 located in the filtering means 30. When the adjustment means 20 receives the control signal from the generating means 140, the adjustment means moves the adjustment element 31, and the filtering means 30 is then tuned to the desired frequency or the frequency band. The tuning continues until the return loss value estimated by the measuring means 90 reaches a minimum, for example. Aforesaid is accurate when the return loss which is expressed in dB tells how much the reflected power is smaller than the power which is proceeded into the filtering means 30. More accurately said in aforesaid situation the return loss means reflection loss which is tried to minimize.

When the return loss value which is expressed in dB means the power loss which is due to the reflection, the tuning tries to maximize the return loss value. More accurately said in the invention it is tried to maximize the power which is proceeded into the filtering means 30. In other words the tuning is based on the comparison with the estimation result and the predetermined limit value of the return loss.

Controlled by the generating means 140, the adjustment means 20 may go through all the adjustment values located in its adjustment area. In the adjustment, the adjustment means 20 may also use adjustment steps of different sizes, for instance. The measuring means 90 stores the return loss values obtained on the basis of different adjustment values and notifies the generating means 140 of the smallest return loss value given by the adjustment value of the adjustment means 20. Next, the generating means 140 directs the adjustment means 20, such as a stepping motor, to move the adjustment element 31 to the point or the adjustment value which enabled the estimation of the smallest return loss value.

As mentioned above, the modulation means 170 places the modulated test signal into a time slot. Typically, the test signal is placed into a time slot the use of which is least harmful to the other parts of the base station. A time slot of the above type is an idle time slot, for example. Typically, every $26^{th}$ time slot is an idle time slot. For tuning, the use of the idle time slot is advantageous, since subscriber terminals, such as mobile phones, do not normally transmit a signal in the idle time slot. The tuning of the filtering means 30 can also be advantageously implemented during pauses in a call. The base station or the base station controller is notified of channel reservation situation at a given time and of free time slots to which a test signal can be transmitted when necessary. The filtering means 30 can be tuned with the help of the idle time slots eight times in a second, for instance. The use of the idle time slot thus enables the filtering means 30 to be tuned during the normal operation of the base station.

For testing the transceiver unit, different types of loops are used, by means of which a signal is routed to a desired direction. The transceiver unit can be provided with what is known as a TRX loop by connecting the output signal of the transmitter to the receiver over a cable or via a radio path, for instance. In addition, a signal on the transmitter end of the transceiver unit can be connected internally to the receiver end. In other words, the signal is connected from the transmitter end to the receiver end in such a way that the signal does not need to pass through the transmitting antenna or the receiving antenna. In the solution of the invention, the generating means 140 switches on the internal TRX loop of the transceiver unit for the duration of the tuning of the filtering means 30. It is possible to connect the signals doubled by the means 160 via the TRX loop to the measuring means 90 located on the receiver end where the signals are measured. The TRX loop enables the signal to be connected from the connecting means 190 to the connecting means 180.

Figure 3:
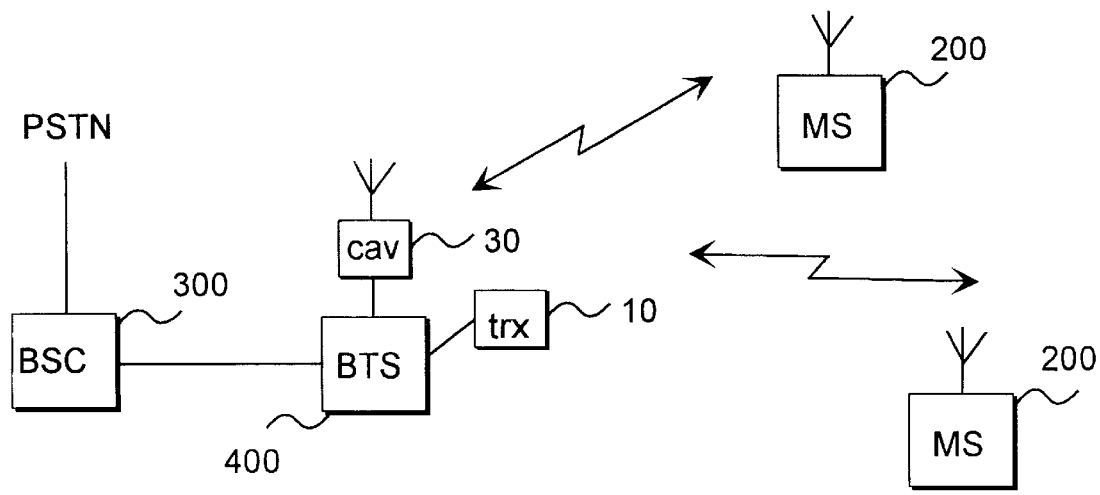
FIG. 3 shows a radio system applying the method of the invention.

FIG. 3 shows a radio system applying the method of the invention. The radio system comprises subscriber terminals 200, a base station 400 operating as a transceiver, and a base station controller 300. In addition, the base station 400 comprises at least one transceiver unit 10. The base station 400 further comprises at least one filtering means 30 which is separate from the transceiver unit 10. In the method of the invention, the filtering means 30, such as a cavity resonator, is tuned to operate at a desired frequency. The tuning can be carried out upon commissioning, or during the operation, of the base station.

Although the invention is described above with reference to the example according to the accompanying drawings, it is obvious that the invention is not restricted thereto but it can be modified in many ways within the scope of the inventive idea disclosed in the attached claims.

What is claimed is:

1. A tuning method used in a base station which includes at least one transceiver unit and a filtering means which is separate from the transceiver unit and filters signals which are generated on the transmitting end of the transceiver unit, of which signals part advances to the filtering means and part is reflected back from the filtering means, and in which method the filtering means is tuned to operate in a predetermined frequency band, the method comprising:

generating a test signal which is located in a predetermined frequency band and transmitted to a filtering means, generating signals of the same magnitude as the signal which advances to the filtering means and is reflected from the filtering means, and which signals are connected from a transmitting end to a receiving end of a transceiver unit, measuring the power of the signals that are connected to the receiving end, estimating a return loss of the filtering means on the basis of the power values measured, and when the return loss is greater than a limit value predetermined for the return loss, the filtering means is tuned to carry out a more efficient filtering of the predetermined frequency band.

2. The method as claimed in claim 1, wherein the signals of the same magnitude as the signal which advances to the filtering means from the transmitting end of the transceiver and is reflected from the filtering means are generated by doubling the signal which advances to the filtering means and is reflected from the filtering means.

3. The method as claimed in claim 1, wherein the signals of the same magnitude as the signal which propagates to the filtering means and is reflected from the filtering means are connected from the transmitting end to the receiving end of the transceiver.

4. The method as claimed in claim 1, wherein a TRX loop is switched on for the duration of the tuning, which TRX loop is located in the transceiver unit and through which the signals are connected from the transmitting end to the receiving end.

5. The method as claimed in claim 1, wherein the filtering means is implemented by a cavity resonator that is adjusted by a motor which is controlled to adjust the tuning of the cavity resonator on the basis of a return loss value obtained.

6. The method as claimed in claim 1, wherein a test signal is transmitted to a predetermined time slot, and the filtering means is tuned during idle time slots.

7. A tuning method used in a base station which includes at least one transceiver unit and a filtering means which is separate from the transceiver unit and filters signals which are generated on the transmitting end of the transceiver unit, of which signals part advances to the filtering means and part is reflected back from the filtering means, and in which method the filtering means is tuned to operate in a predetermined frequency band, the method comprising:

generating a test signal which is located in a predetermined frequency band and transmitted to a filtering means, generating signals of the same magnitude as the signal which advances to the filtering means and is reflected from the filtering means, and which signals are connected from a transmitting end to a receiving end of a transceiver unit, measuring the power of the signals that are connected to the receiving end, estimating a return loss of the filtering means on the basis of the power values measured, and turning the filtering means on the basis of the comparison with the estimation result and the predetermined limit value of the return loss.

8. The method as claimed in claim 7, wherein the power of the signals which are connected to the receiving end is measured by indicating the signal in narrow bandwidth.

9. A transceiver unit used in a base station comprising:

in addition to at least one signal-generating transceiver unit, a filter means which is separate from a transceiver unit and filters signals which are generated at a transmitting end of the transceiver, and of which signals part advances to the filtering means and part is reflected back, and which filter means is tuned to operate in a predetermined frequency band, wherein the transceiver unit comprises a test signal generating means which generates a control signal and a test signal that is located in a predetermined frequency band, which test signal is transmitted further to the filtering means, a means which generates signals of the same magnitude as the signal which advances to the filtering means and is reflected from the filtering means, which signals are connected from the transmitting end to a receiving end of the transceiver, a measuring instrument which measures the power of the signals which are connected to the receiving end and estimates the return loss of the filtering means on the basis of the powers measured, an adjustment means which receives the control signal from the generating means and tunes the filtering means on the basis of the control signal it has received if a return loss value obtained as an estimation result is greater than the predetermined limit value of the return loss.

10. The transceiver unit as claimed in claim 9, wherein the circulator means doubles the signal which advances to the filtering means and is reflected from the filtering means and transmits the signals that are doubled from the transmitting end of the transceiver to the receiving end of the transceiver.

11. The transceiver unit as claimed in claim 9, wherein a TRX loop is generated for the transceiver unit, which TRX loop is switched on for the duration of the tuning and through which the signals are connected from the transmitting end to the receiving end.

12. The transceiver unit as claimed in claim 9, wherein the measuring means measures the power of the signals that are connected to the receiving end by first indicating the signal to be measured in narrow bandwidth.

13. The transceiver unit as claimed in claim 9, wherein the transceiver unit is operationally connected to the adjustment means which receives the control signal generated by the generating means and tunes the filtering means to carry out a more efficient filtering of the signals by means of the control signal received.

14. The transceiver unit as claimed in claim 9, wherein the filtering means is implemented by a cavity resonator, and the adjustment means is controlled on the basis of the return loss value obtained.

15. The transceiver unit as claimed in claim 9, wherein the filtering means is implemented by the cavity resonator which comprises an adjustment element, the adjustment means moves the adjustment element on the basis of the control signal, whereby the filtering band of the cavity resonator changes.

16. The transceiver unit as claimed in claim 9, wherein the filtering means is tuned during an idle time slot.

17. A transceiver unit used in a base station comprising:

in addition to at least one signal-generating transceiver unit, a filter means which is separate from a transceiver unit and filters signals which are generated at a transmitting end of the transceiver, and of which signals part advances to the filtering means and part is reflected back, and which filter means is tuned to operate in a predetermined frequency band, where in the transceiver unit comprises a test signal generating means which generates a control signal and a test signal that is located in a predetermined frequency band, which test signal is transmitted further to the filtering means, a means which generates signals of the same magnitude as the signal which advances to the filtering means and is reflected from the filtering means, which signals are connected from the transmitting end to a receiving end of the transceiver, a measuring instrument which measures the power of the signals which are connected to the receiving end and estimates the return loss of the filtering means on the basis of the powers measured, an adjustment means which receives the control signal from the generating means and tunes the filtering means on the basis of the control signal it has received based on the comparison with an estimation result and the predetermined limit value of the return loss.

* * * * *